(12) United States Patent
Park et al.

(10) Patent No.: US 9,939,845 B2
(45) Date of Patent: Apr. 10, 2018

(54) DISPLAY DEVICE AND METHOD FOR MANUFACTURING SAME

(71) Applicant: Samsung Display Co., Ltd., Yongin-si, Gyeonggi-do (KR)

(72) Inventors: Jaechun Park, Cheonan-si (KR); Younhwan Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 15/163,440

(22) Filed: May 24, 2016

(65) Prior Publication Data

US 2017/0090517 A1 Mar. 30, 2017

(30) Foreign Application Priority Data

Sep. 30, 2015 (KR) .................. 10-2015-0138104

(51) Int. Cl.
| | |
|---|---|
| *H05K 1/00* | (2006.01) |
| *H05K 1/18* | (2006.01) |
| *H05K 7/00* | (2006.01) |
| *G06F 1/16* | (2006.01) |
| *G06F 3/041* | (2006.01) |
| *H05K 3/12* | (2006.01) |
| *H05K 13/00* | (2006.01) |
| *H05K 1/02* | (2006.01) |

(52) U.S. Cl.
CPC .......... *G06F 1/1643* (2013.01); *G06F 3/0412* (2013.01); *H05K 1/0269* (2013.01); *H05K 3/12* (2013.01); *H05K 13/0023* (2013.01); *G06F 2203/04102* (2013.01); *G06F 2203/04103* (2013.01); *H05K 2201/10136* (2013.01); *H05K 2201/10151* (2013.01); *H05K 2203/166* (2013.01)

(58) Field of Classification Search
USPC ................................. 361/748, 760
See application file for complete search history.

(56) References Cited

U.S. PATENT DOCUMENTS

| | | | |
|---|---|---|---|
| 2013/0057552 A1* | 3/2013 | Yoshiwa ............. | H01J 37/3026 345/441 |
| 2015/0177370 A1* | 6/2015 | Trummer ............. | G01S 17/023 356/5.01 |

FOREIGN PATENT DOCUMENTS

| KR | 10-2013-0035509 A | 4/2013 |
|---|---|---|
| KR | 10-2015-0017991 A | 2/2015 |

\* cited by examiner

*Primary Examiner* — Andargie M Aychillhum
(74) *Attorney, Agent, or Firm* — Lewis Roca Rothgerber Christie LLP

(57) ABSTRACT

A method of manufacturing a display device includes providing a window including a printed area and a plurality of alignment key areas, patterning a printed layer on the printed area such that the plurality of alignment key areas is exposed and the printed layer covers the printed area, aligning a panel to the window by using the plurality of alignment key areas, and coupling the panel to the window.

6 Claims, 8 Drawing Sheets

DISPLAY DEVICE AND METHOD FOR MANUFACTURING SAME

CROSS-REFERENCE TO RELATED APPLICATIONS

This U.S. non-provisional patent application claims priority to and the benefit of Korean Patent Application No. 10-2015-0138104, filed on Sep. 30, 2015 in the Korean Intellectual Property Office (KIPO), the entire contents of which are hereby incorporated by reference.

BACKGROUND

The present disclosure herein relates to a display device and a method for manufacturing the same.

Use of mobile phones, tablet PCs, and other mobile electronic devices has become increasingly widespread in recent years. These mobile electronic devices include display devices for providing visual information such as images or pictures in order to support various functions. As components for driving the display devices are miniaturized, the sizes of the display devices tend to increase in proportion to the overall size of the electronic devices. In particular, recently, as designs of electronic devices have diversified, the desirability of flexible display devices has increased.

SUMMARY

According to an embodiment of the present invention, a panel and a window of a display device are aligned by using a plurality of alignment key areas.

An embodiment of the inventive concept provides a method of manufacturing a display device, the method including: providing a window having a printed area and a plurality of alignment key areas; patterning a printed layer on the printed area such that the plurality of alignment key areas is exposed and the printed layer covers the printed area; aligning a panel to the window by using the plurality of alignment key areas; and coupling the panel to the window.

In an embodiment, the panel may be a touch panel.

In an embodiment, the method may further include forming a plurality of first alignment marks on the touch panel.

In an embodiment, the aligning of the touch panel to the window may include: sensing positions of alignment keys in the plurality of alignment key areas; determining an alignment center point of the window by using the sensed alignment key positions; sensing first positions of the plurality of first alignment marks; determining a first center point of the touch panel by using the sensed first positions; and overlapping the alignment center point and the first center point.

In an embodiment, the method may further include aligning a display panel to the window using the plurality of alignment key areas.

In an embodiment, the method may further include forming a plurality of second alignment marks on the display panel, wherein the aligning of the display panel to the window may include: sensing positions of the alignment keys in the plurality of alignment key areas; determining the alignment center point of the window by using the sensed alignment key positions; sensing second positions of the plurality of second alignment marks; determining a second center point of the display panel by using the sensed second positions; and overlapping the alignment center point and the second center point.

In an embodiment, the method may further include coupling the display panel to the window with the touch panel therebetween.

In an embodiment, the patterning of the printed layer may include printing a printing material on the printed area.

In an embodiment, the patterning of the printed layer may include attaching a printed film on the printed area.

In an embodiment, shapes of the plurality of alignment key areas when viewed in a plane may be at least one of '+', a diamond, '−', 'x', or 'T'.

In an embodiment, a shape of each of the plurality of alignment key areas when viewed in a plane may have at least one vertex.

In an embodiment of the inventive concept, a display device includes: a window including a window and a plurality of alignment key areas spaced apart from each other; a printed layer configured to cover the printed area and to expose the plurality of alignment key areas; and a touch panel including a plurality of first alignment marks spaced apart from each other, wherein an alignment center point, defined by an intersection of imaginary lines which connect positions of alignment keys in the plurality of alignment key areas, and a first center point, defined by imaginary lines which connect first positions of the plurality of first alignment marks, are overlapped.

In an embodiment, the display device may further include a display panel including a plurality of second alignment marks spaced apart from each other, wherein the alignment center point and a second center point, defined by an intersection of imaginary lines connecting second positions of the plurality of second alignment marks, may be overlapped.

In an embodiment, the window may include a display part on which images are displayed and a non-display part configured to block images, the non-display part may include the plurality of alignment key areas and the printed areas, and a shape of the display part when viewed in a plane may be substantially circular or elliptical.

In an embodiment, the display part may be symmetrical with respect to an imaginary X-axis parallel to a first direction and symmetrical with respect to an imaginary Y-axis parallel to a second direction, and a second center point of the display part may be an intersection of the X-axis and the Y-axis.

In an embodiment, the printed layer may be on the printed area and may include a printing material.

In an embodiment, the printing material may include a printed film.

BRIEF DESCRIPTION OF THE FIGURES

The accompanying drawings are included to facilitate a greater understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
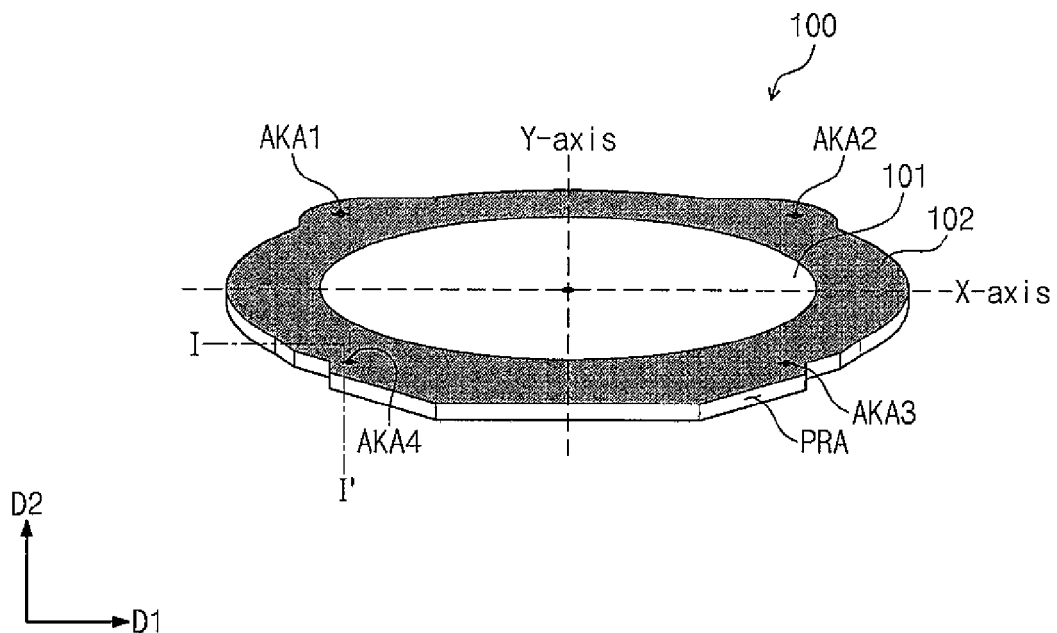
FIG. 1A is a front view of a display device according to an embodiment of the inventive concept.

The inventive concept may be modified in many alternate forms, and thus specific embodiments will be exemplified in the drawings and described in detail. It should be understood, however, that it is not intended to limit the inventive concept to the particular forms disclosed herein. The inventive concept covers various suitable modifications and equivalent arrangements included within the spirit and scope of the present disclosure, including the appended claims.

In the descriptions of the drawings, like reference numerals refer to like elements (or components) throughout. In the drawings, the dimensions and size of each structure may be exaggerated, omitted, or schematically illustrated for convenience in description and clarity.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Exemplary embodiments of the present disclosure will be described below in more detail with reference to the accompanying drawings.

Figure 1B:
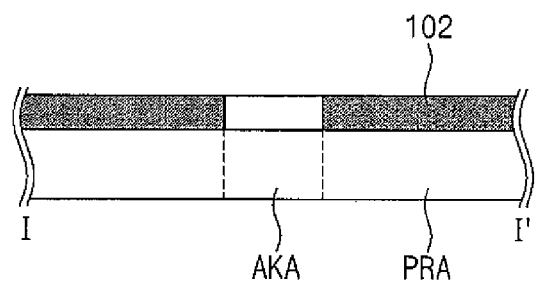
FIG. 1B is a cross-sectional view taken along the line I-I' illustrated in FIG. 1A.

FIG. 1A is a front view of a display device according to an embodiment of the inventive concept, and FIG. 1B is a cross-sectional view taken along the line I-I' illustrated in FIG. 1A.

Referring to FIGS. 1A and 1B, a display device 1000 (e.g., see FIG. 4B) includes a window 100 and a printed layer 102. In an example of the inventive concept, the printed layer 102 may be disposed on the window 100.

The window 100 according to an embodiment of the inventive concept may include a display part 101 for displaying images and a non-display part for blocking images.

The window 100 may be formed of a transparent material. For example, the window 100 may be formed of rigid glass. Also, the window 100 may include a flexible polymer bent and/or bendable by external force. The window 100 may include a polymer having superior heat resistance, durability, and flexibility, such as polyethylene terephthalate, polyethylene naphthalate, polycarbonate, polyarylate, polyetherimide, polyether sulfone, polyimide, and polymethyl methacrylate.

The display part 101 may have a circular or an elliptical shape. For example, the display part 101 may be symmetrical with respect to an imaginary X-axis parallel to a first direction D1. At the same time, the display part 101 may be symmetrical with respect to an imaginary Y-axis parallel to a second direction D2 which is perpendicular to the first direction D1. The center point of the display part 101 may be at an intersection of the X-axis and the Y-axis.

The non-display area may include a printed area PRA and a plurality of alignment key areas AKA1 through AKA4.

The printed layer 102 may be patterned on the printed area PRA. For example, the printed layer 102 may be formed through a method in which a printing material is printed on the printed area PRA, or through a method in which a printed film is attached to the printed area PRA.

The printed layer 102 and the printed film may include a printing material. The color of the printing material may be non-white. In an example of the inventive concept, the color of the printing material may be black, and may include a light-blocking material.

Accordingly, the printed layer 102 may block the light emitted from a display panel PA described hereinbelow.

The plurality of alignment key areas AKA1 through AKA4 may be defined as an area in the non-display part where the printed area PRA is not formed.

In an example of the inventive concept, each of the plurality of alignment key areas AKA1 through AKA4 may be spaced apart from each other. For example, as illustrated in FIG. 1A, the non-display part may include four alignment key areas.

The four alignment key areas may be defined, clockwise from the alignment key area disposed at an upper left side thereof, as a first alignment key area AKA1, a second alignment key area AKA2, a third alignment key area AKA3, and a fourth alignment key area AKA4.

For example, with respect to the Y-axis, the first alignment key area AKA1 and the second alignment key area AKA2 may be symmetrical, and the third alignment key area AKA3 and the fourth alignment key area AKA4 may be symmetrical.

Likewise, with respect to the X-axis, the first alignment key area AKA1 and the fourth alignment key area AKA4 may be symmetrical, and the second alignment key area AKA2 and the third alignment key area AKA3 may be symmetrical.

The plurality of alignment key areas AKA1 through AKA4 may be used for aligning the touch panel TPA (see FIG. 2) and the display panel PA (e.g., see FIG. 3) to the window 100. The process by which the touch panel TPA and the display panel PA are aligned to the window 100 will be described in detail with reference to FIG. 3.

In an example embodiment of the inventive concept, the shapes of the plurality of alignment key areas AKA1 through AKA4, when viewed in a plane, may be the same or substantially the same, and the shapes of the plurality of alignment key areas AKA1 through AKA4, when viewed in a plane, may include at least one vertex. For example, the shapes of the plurality of alignment key areas AKA1 through AKA4, when viewed in a plane, may be shapes of '+', a diamond, '−', 'x', or 'T'. In FIG. 1A, for example, the plurality of alignment key areas AKA1 through AKA4 are illustrated as having the shape of '+'.

As illustrated in FIG. 1B, the printed layer 102 is disposed on an upper surface of the window 100. The printed layer 102 may cover the printed area PRA and expose the plurality of alignment key areas AKA1 through AKA4. FIG. 1B illustrates a portion of the alignment key area AKA4 as having the shape of '+'.

Accordingly, when the window 100 and the printed layer 102 are viewed from the outside, areas corresponding to the plurality of alignment key areas may be transparent, and areas corresponding to the printed area PRA may be opaque.

Figure 2:
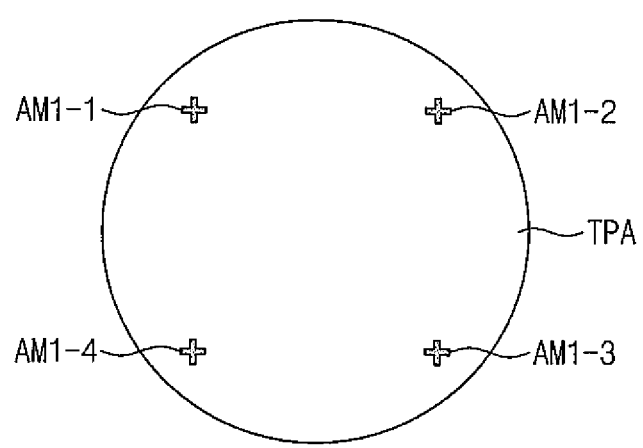
FIG. 2 is a cross-sectional view of a touch panel according to an embodiment of the inventive concept.

FIG. 2 is a cross-sectional view of a touch panel according to an embodiment of the inventive concept.

Referring to FIG. 2, the touch panel TPA may have a circular shape.

The touch panel TPA may include a plurality of first alignment marks AM1-1 through AM1-4. The plurality of first alignment marks AM1-1 through AM1-4 may be patterns formed of a metallic material.

In an example of the inventive concept, each of the plurality of first alignment marks AM1-1 through AM1-4 may be spaced apart from each other.

The four first alignment marks may be defined, clockwise from the first alignment mark disposed at an upper left side, as a 1-1 alignment mark AM1-1, a 1-2 alignment mark AM1-2, a 1-3 alignment mark AM1-3, and a 1-4 alignment mark AM1-4.

The shapes of the plurality of first alignment marks AM1-1 through AM1-4, when viewed in a plane, may be the same or substantially the same as one another, and each of the shapes of the plurality of first alignment marks AM1-1 through AM1-4, when viewed in a plane, may have at least one vertex. The shapes of the plurality of alignment marks AM1-1 through AM1-4, when viewed in a plane, may be shapes of '+', a diamond, '−', 'x', or 'T'.

The plurality of alignment marks AM1-1 through AM1-4 may be used for aligning the touch panel TPA to the window 100.

Figure 3:
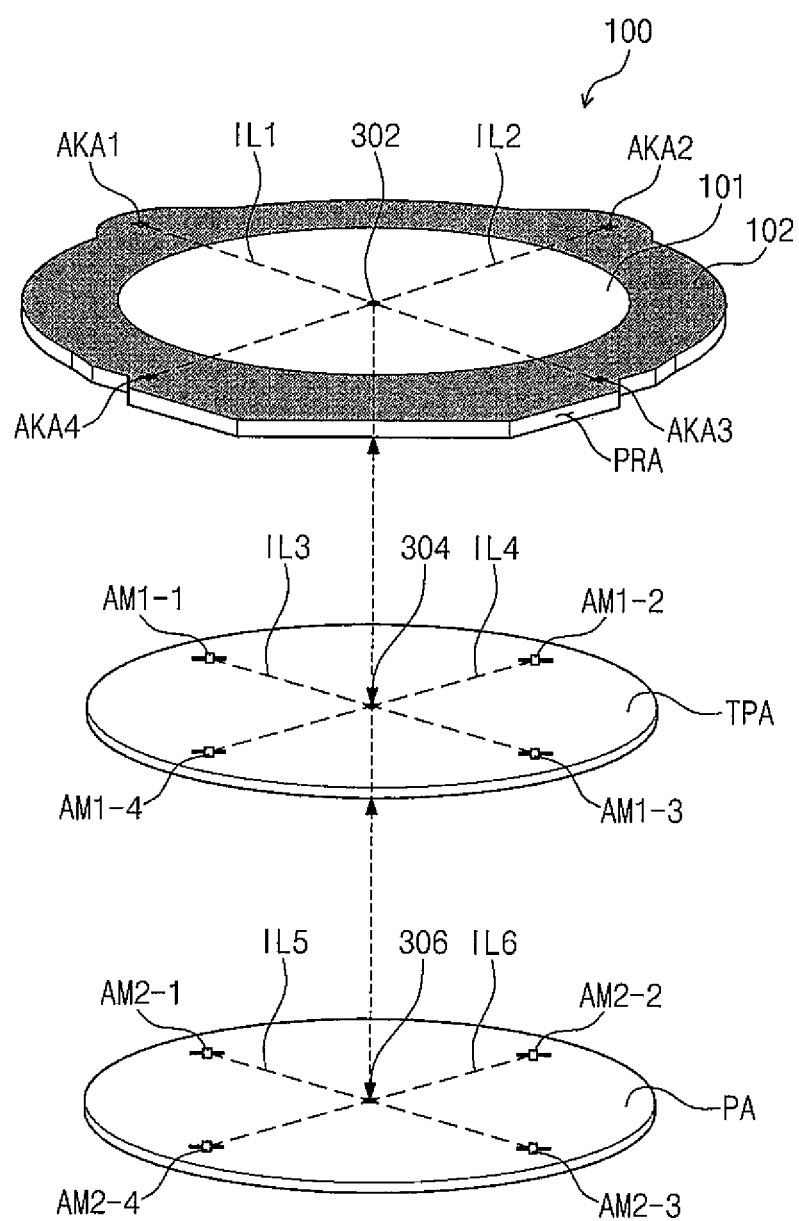
FIG. 3 is a view for describing a process in which a touch panel and a display panel according to an embodiment of the inventive concept are aligned.

FIG. 3 is a view for describing a process in which a touch panel and a display panel according to an embodiment of the inventive concept are aligned;

Although only the touch panel TPA is described with reference to FIG. 2, the display panel PA may also, like the touch panel (TPA), include a plurality of second alignment marks AM2-1 through AM2-4. The plurality of second alignment marks AM2-1 through AM2-4 may be patterns formed of a metallic material.

In an example of the inventive concept, each of the plurality of second alignment marks AM2-1 through AM2-4 may be spaced apart from each other.

The four second alignment marks may be defined, clockwise from the second alignment mark disposed at an upper left side, as a 2-1 alignment mark AM2-1, a 2-2 alignment mark AM2-2, a 2-3 alignment mark AM2-3, and a 2-4 alignment mark AM2-4.

The shapes of the plurality of second alignment marks AM2-1 through AM2-4, when viewed in a plane, may be the same or substantially the same as one another, and each of the shapes of the plurality of second alignment marks AM2-1 through AM2-4, when viewed in a plane, may have at least one vertex. The shapes of the plurality of second alignment marks AM2-1 through AM2-4, when viewed in a plane, may be shapes of '+', a diamond, '−', 'x', 'T,' or combination thereof.

The position of the first alignment key may be defined in the first alignment key area AKA1, and the position of the third alignment key may be defined in the third alignment key area AKA3. In an example of the inventive concept, the position of the first alignment key may be the center of the first alignment key area AKA1, may be on a border of the first alignment key area AKA1, or may be on a vertex which is defined by the borders of the first alignment key area AKA1. Likewise, in an example of the inventive concept, the position of the third alignment key may be the center of the third alignment key area AKA3, or may be on a border of the third alignment key area AKA3 or on a vertex which is defined by the borders of the third alignment key area AKA3.

The first alignment key area AKA1 and the third alignment key area AKA3 may have the same or substantially the same shape, and thus when symmetrizing the first alignment key area AKA1 with respect to the X-axis and the Y-axis to overlap the third alignment key area AKA3, the positions of the first alignment key and the third alignment key may be overlapped.

The position of the second alignment key may be defined in the second alignment key area AKA2, and the position of the fourth alignment key may be defined in the fourth alignment key area AKA4. In an example of the inventive concept, the position of the second alignment key may be the center of the second alignment key area AKA2, may be on a border of the second alignment key area AKA2, or may be on a vertex which is defined by the borders of the second alignment key area AKA2. Likewise, in an example of the inventive concept, the position of the fourth alignment key may be the center of the fourth alignment key area AKA4, may be on a border of the fourth alignment key area AKA4, or may be on a vertex which is defined by the borders of the fourth alignment key area AKA4.

The second alignment key area AKA2 and the fourth alignment key area AKA4 may have the same or substantially the same shape, and thus when symmetrizing the second alignment key area AKA2 with respect to the X-axis and the Y-axis to overlap the fourth alignment key area AKA4, the positions of the second alignment key and the fourth alignment key may be overlapped.

An alignment center point 302 may be on the center of the window 100. The alignment center point 302 may be the intersection of a first imaginary line IL1 connecting the positions of the first alignment key and the third alignment key and a second imaginary line IL2 connecting the positions of the second alignment key and the fourth alignment key.

In relation to the touch panel, a 1-1 position may be on the 1-1 alignment mark AM1-1, and a 1-3 position may be on the 1-3 alignment mark AM1-3.

In an example of the inventive concept, the 1-1 position may be the center of the 1-1 alignment mark AM1-1, may be on a border of the 1-1 alignment mark AM1-1, or may be on a vertex which is defined by the borders of the 1-1 alignment mark AM1-1. Likewise, the 1-3 position may be the center of the 1-3 alignment mark AM1-3, may be on a border of the 1-3 alignment mark AM1-3, or may be on a vertex which is defined by the borders of the 1-3 alignment mark AM1-3.

In the same manner, a 1-2 position may be on the 1-2 alignment mark AM1-2, and a 1-4 position may be on the 1-4 alignment mark AM1-4.

In an example of the inventive concept, the 1-2 position may be the center of the 1-2 alignment mark AM1-2, may be on a border of the 1-2 alignment mark AM1-2, or may be on a vertex which is defined by the borders of the 1-2 alignment mark AM1-2. Likewise, the 1-4 position may be the center of the 1-4 alignment mark AM1-4, may be on a border of the 1-4 alignment mark AM1-4, or may be on a vertex which is defined by the borders of the 1-4 alignment mark AM1-4.

A first center point 304 may be on the center of the touch panel TPA. The first center point 304 may be defined as the intersection of a third imaginary line IL3 connecting the 1-1 position and the 1-3 position and a fourth imaginary line IL4 connecting the 1-2 position and the 1-4 position.

In relation to the display panel PA, a 2-1 position may be on the 2-1 alignment mark AM2-1, and a 2-3 position may be on the 2-3 alignment mark AM2-3.

In an example of the inventive concept, the 2-1 position may be the center of the 2-1 alignment mark AM2-1, may be on a border of the 2-1 alignment mark AM2-1, or may be on a vertex which is defined by the borders of the 2-1 alignment mark AM2-1. Likewise, the 2-3 position may be the center of the 2-3 alignment mark AM2-3, may be on a border of the 2-3 alignment mark AM2-3, or may be on a vertex which is defined by the borders of the 2-3 alignment mark AM2-3.

In the same manner, a 2-2 position may be on the 2-2 alignment mark AM2-2, and a 2-4 position may be on the 2-4 alignment mark AM2-4.

In an example of the inventive concept, the 2-2 position may be the center of the 2-2 alignment mark AM2-2, may be on a border of the 2-2 alignment mark AM2-2, or may be on a vertex which is defined by the borders of the 2-2 alignment mark AM2-2. Likewise, the 2-4 position may be the center of the 2-4 alignment mark AM2-4, may be on a border of the 2-4 alignment mark AM2-4, or may be on a vertex which is defined by the borders of the 2-4 alignment mark AM2-4.

A second center point 306 may be on the center of the display panel PA. The second center point 306 may be defined as the intersection of a fifth imaginary line IL5 connecting the 2-1 position and the 2-3 position and a sixth imaginary line IL6 connecting the 2-2 position and the 2-4 position.

The display device 1000 (see FIG. 4B), according to an embodiment of the inventive concept, may include the window 100, the touch panel TPA, and the display panel PA, wherein the alignment center point 302 and the first center point 304 may be overlapped, and the alignment center point 302 and the second center point 306 may be overlapped. Consequently, the alignment center point 302, the first center point 304, and the second center point 306 may be overlapped as one point.

Figure 4A:
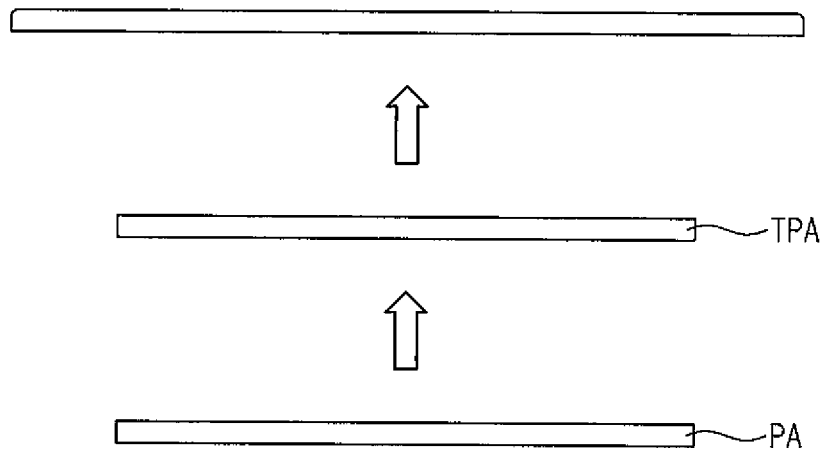
FIG. 4A is a view describing a process in which a display panel and a touch panel are coupled to a window according to an embodiment of the inventive concept.
Figure 4B:
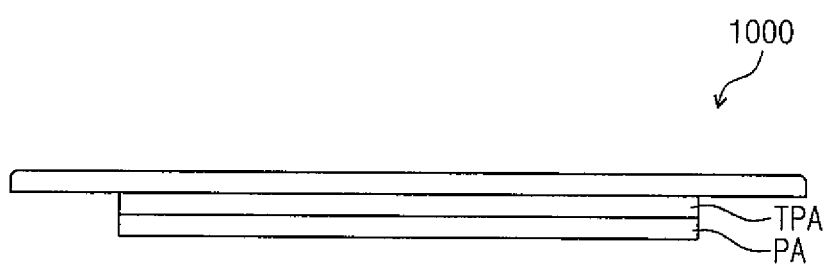
FIG. 4B is a side view of a display device according to the process described with reference to FIG. 4A.

FIG. 4A is a view describing a process in which a display panel and a touch panel are coupled to a window according to an embodiment of the inventive concept, and FIG. 4B is a side view of a display device according to the process described with reference to FIG. 4A.

Referring to FIGS. 4A and 4B, as described with reference to FIG. 3, after the first center point 304 is aligned to the alignment center point 302, the touch panel TPA is coupled to the window 100.

The touch panel TPA may be coupled to the window 100 through, for example, an adhesive member.

Next, as described with reference to FIG. 3, after the second center point 306 is aligned to the alignment center point 302, the display panel PA is coupled to the window 100.

The display panel PA may be coupled to the window 100 through, for example, an adhesive member. The display panel PA may be attached to a rear surface of the touch panel TPA.

Accordingly, as described above, the display device 1000 may include the window 100, the touch panel TPA, and the display panel PA; the touch panel TPA may be provided at a rear surface side of the window 100; and the display panel PA may be provided at a rear surface side of the touch panel TPA.

FIGS. 5A through 5D are views illustrating various examples of alignment key areas of the inventive concept.

Figure 5A:
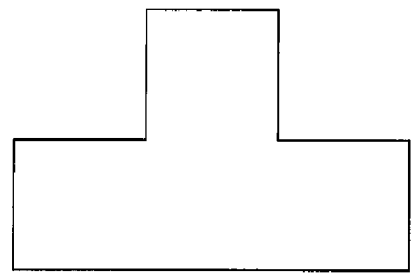
FIGS. 5A through 5D are views illustrating various examples of alignment key areas of embodiments of the inventive concept.
Figure 5B:
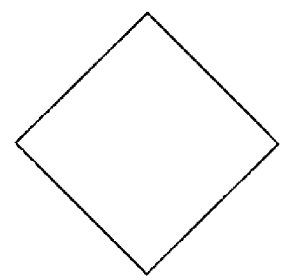

Referring to FIG. 5A, the shapes of the plurality of alignment key areas AKA1 through AKA4 when viewed in a plane may be a shape of '⊥', and referring to FIG. 5B, the shapes of the plurality of alignment key areas AKA1 through AKA4 when viewed in a plane may be a diamond shape.

Figure 5C:
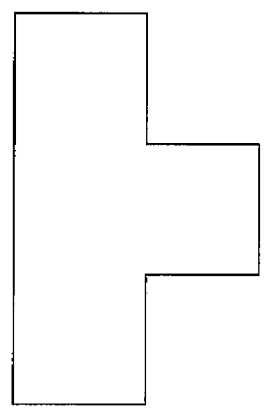
Figure 5D:
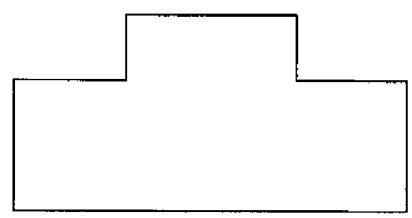

Referring to FIG. 5C, the shapes of the plurality of alignment key areas AKA1 through AKA4 when viewed in a plane may be a shape of '⊢', and referring to FIG. 5D, the shapes of the plurality of alignment key areas AKA1 through AKA4 when viewed in a plane may be a shape of '⊥'.

Also, in FIGS. 5A through 5D, the shapes of the plurality of alignment key areas AKA1 through AKA4 when viewed in a plane may be '–', 'x', and/or an arbitrary figure which includes one or more vertexes in a cross section thereof.

Figure 6:
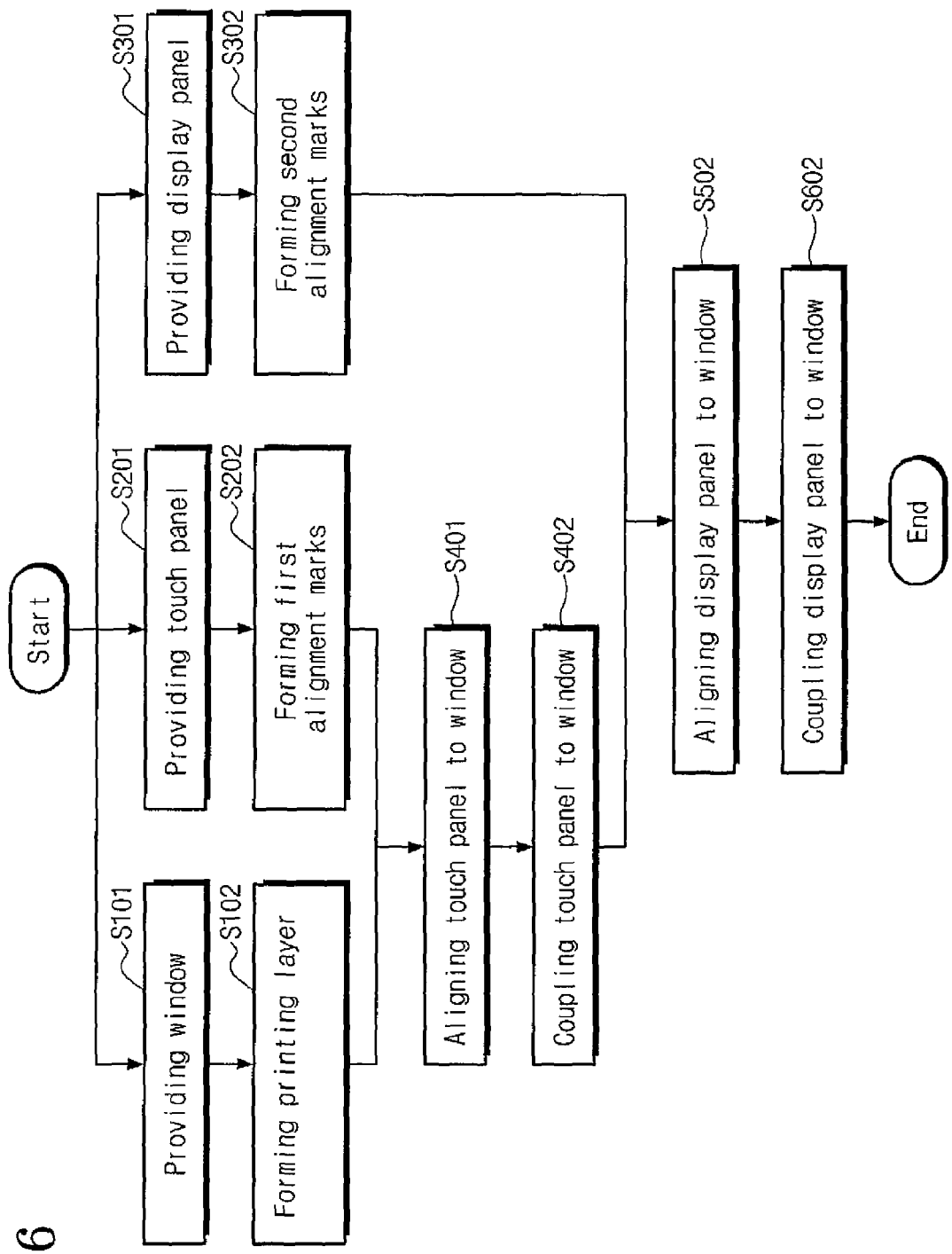
FIG. 6 is a flow chart of a method for manufacturing a display device according to an embodiment of the inventive concept.
Figure 7:
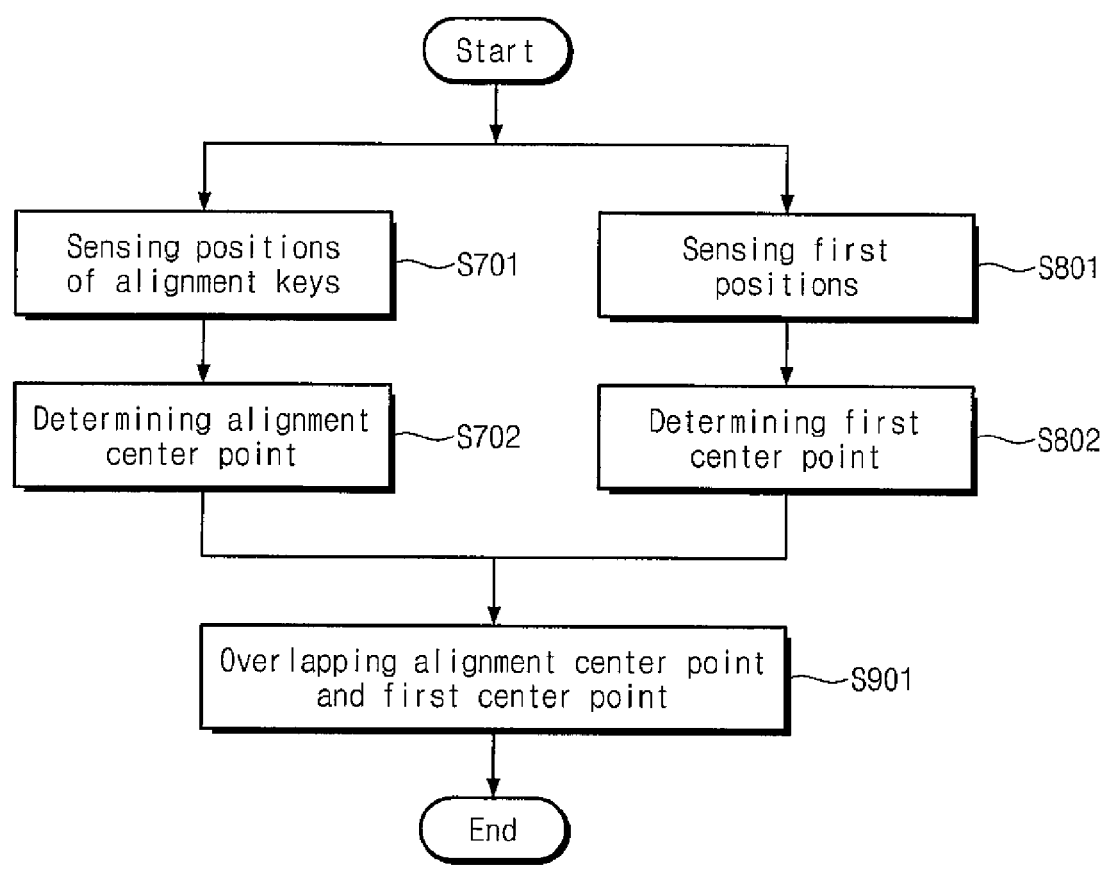
FIG. 7 is a flow chart of the box S401 illustrated in FIG. 6.

FIG. 6 is a flow chart of a method for manufacturing a display device which is an embodiment of the inventive concept, and FIG. 7 is a flow chart of the box S401 illustrated in FIG. 6.

Referring to FIGS. 3 and 6, a window 100 is provided to be part of a display device 1000 according to an embodiment of the inventive concept (S101). Then, a printed layer 102 is formed on a printed area PRA (S102). A plurality of alignment key areas AKA1 through AKA4 and the printed layer 102 may be defined by providing the printed layer 102. The method for patterning the printed layer 102 has already been described and thus may not be repeated.

A touch panel is provided (S201) and a plurality of first alignment marks AM1-1 through AM1-4 are formed on the touch panel TPA (S202). Next, a display panel PA is provided (S301) and a plurality of second alignment marks AM2-1 through AM2-4 are formed on the display panel PA (S302). The plurality of first alignment marks AM1-1 through AM1-4 and the plurality of second alignment marks AM2-1 through AM2-4 may be a patterned metallic material.

The touch panel TPA is aligned to the window 100 (S401).

The box S401 will be described in detail with reference to FIG. 7. The positions of the alignment keys are sensed by using a plurality of alignment key areas AKA1 through AKA4 (S701). In an example of the inventive concept, the positions of the alignment keys may be on center points, borders, and/or vertexes of the plurality of alignment key areas AKA1 through AKA4. In an example of the inventive concept, the positions of the alignment keys are disposed on the window 100, and may be sensed through an imaging device which optically captures the first to fourth key areas AKA1 through AKA4. The imaging device may sense the positions of the alignment keys by effectively detecting vertexes other than curves or straight lines in the plurality of alignment key areas AKA1 through AKA4.

First positions of the touch panel TPA are sensed (S801). In an example of the inventive concept, the first positions may be on center points, borders, or vertexes of the plurality of first alignment marks AM1-1 through AM1-4. In an example of the inventive concept, the first positions are disposed on the touch panel TPA, and may be sensed through the imaging device which captures the 1-1 to 1-4 alignment marks AM1-1 through AM1-4. The imaging device may sense the positions of the alignment keys by effectively detecting vertexes other than curves or straight lines in the plurality of first alignment marks AM1-1 through AM1-4.

An alignment center point 302 is determined by using the sensed positions of the alignment keys (S702). As described above, the alignment center point 302 may be determined as the point at which a first imaginary line IL1 connecting the positions of the first and third alignment keys and a second imaginary line IL2 connecting the positions of the second and fourth alignment keys intersect.

Concurrently with box S702, a first center point 304 is determined (S802). The first center point 304 may be determined as the point at which a third imaginary line IL3 connecting the 1-1 and 1-3 positions and a second imaginary line IL2 connecting the 1-2 and 1-4 positions intersect.

The alignment center point 302 and the first center point 304 are overlapped (S901). For example, the touch panel TPA is moved under the window 100 such that the first center point 304 overlaps the alignment center point 302.

Referring back to FIG. 6, the touch panel TPA (which was moved) is coupled to the window 100 (S402). For example, the touch panel TPA is coupled to a bottom side of the window 100.

The display panel PA is aligned to the window 100 to which the touch panel TPA is coupled (S502).

The process in which the display panel PA is aligned to the window 100 is the same or substantially the same as the above-mentioned process in which the touch panel TPA is aligned to the window 100, and thus a detailed description thereof may be omitted.

Next, the display panel PA is coupled to the window 100 (S602). The display panel PA may be coupled to a lower side of the window through the touch panel TPA. For example, by coupling the display panel PA to the window, the touch panel TPA may be disposed under the window 100, and the display panel PA may be disposed under the touch panel TPA. Consequently, the display device 1000, according to an embodiment of the inventive concept, may be manufactured.

By using the plurality of alignment key areas AKA1 through AKA4 which are exposed and transparently viewed through the printed layer, the window 100 and the touch panel TPA, and the window 100 and the display panel PA may be aligned.

Because a vertex fundamentally exists in typical rectangular windows and the cross-sectional shapes of printed layers on windows, the center point of the rectangular window 100 may be detected by sensing and using the vertexes, and the display panel PA and/or the like may be aligned by using the center point.

In an example of the inventive concept, because, in the window 100, the display part 101 having a circular shape and the cross-sectional shape of the printed layer 102 have no vertex, the center points thereof may not be detected by only using the window 100 and the printed layer 102. However, the window 100 may be aligned to the touch panel TPA and the display panel PA by using the center point of the window 100 which is determined by using the plurality of alignment key areas AKA1 through AKA4 after defining the plurality of alignment key areas AKA1 through AKA4. As a result, existing alignment techniques may be applied and, at the same or substantially the same time, precise alignment effects may be achieved.

Figure 8:
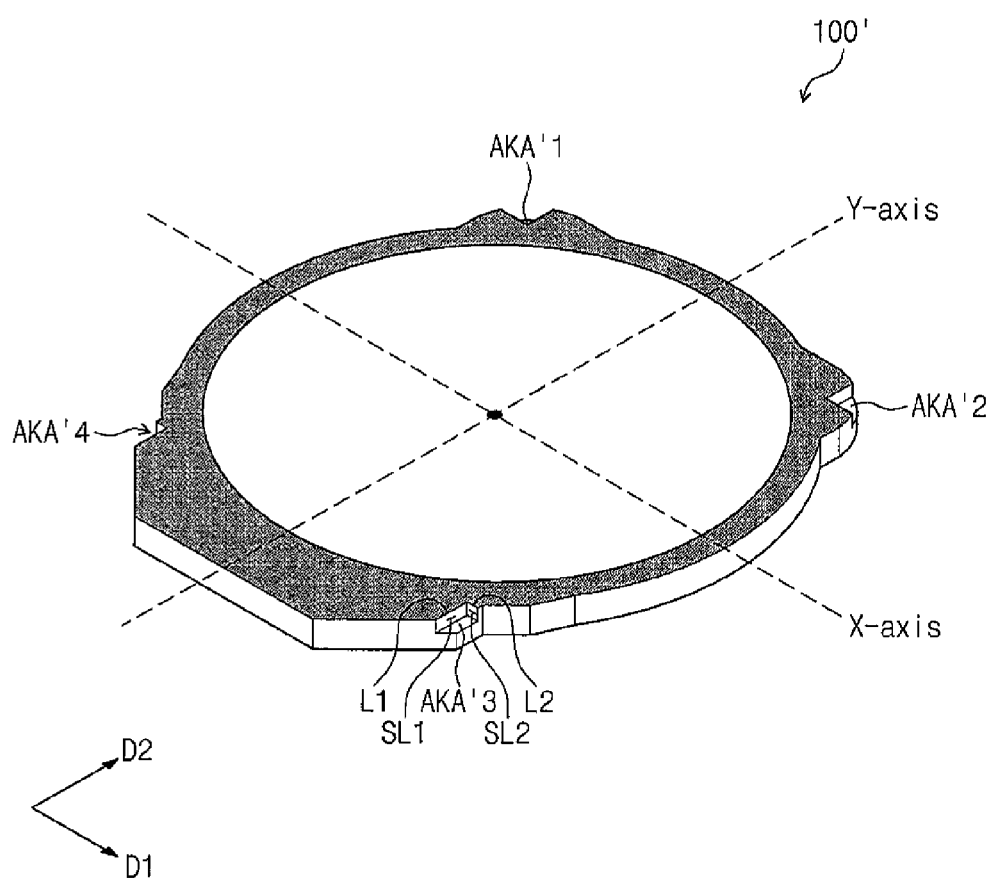
FIG. 8 is a cross-sectional view of a window according to an embodiment of the inventive concept.

FIG. 8 is a cross-sectional view of a window according to another embodiment of the inventive concept.

Referring to FIG. 8, a window 100' illustrated in FIG. 8 has a difference in the shape of a plurality of alignment key areas AKA'1 through AKA'4 when viewed in a plane in comparison with the window 100 illustrated in FIG. 1A. A first border SL1 and a second border SL2 may be defined in the window 100' illustrated in FIG. 8. The first and second borders SL1 and SL2 may be a curved surface or a plane in an example of the inventive concept.

Also, a line segment defined by the first and second borders SL1 and SL2 may be respectively defined as a first line segment L1 and a second line segment L2.

An end of the first line segment L1 and an end of the second line segment L2 are defined as alignment vertexes, and the other ends of the first and second line segments L1 and L2 may be connected by a portion of the edge of the window 100'.

The remaining configuration of the window 100' illustrated in FIG. 8 has already been described and thus may not be described redundantly.

A window may be aligned with a touch panel and a display panel by using a center point of the window determined through a method for manufacturing a display device according to an embodiment of the inventive concept. As a result, existing alignment techniques may be applied and, at the same or substantially the same time, precise alignment effects may be achieved.

While exemplary embodiments of the present invention are described above, a person skilled in the art should understand that many suitable modifications and variations may be made without departing from the spirit and scope of the present disclosure as defined in the following claims and their equivalents.

What is claimed is:

1. A display device comprising:
a window comprising a printed area and a plurality of alignment key areas spaced apart from each other;
a printed layer configured to cover the printed area and to expose the plurality of alignment key areas; and
a touch panel comprising a plurality of first alignment marks spaced apart from each other,
wherein an alignment center point, defined by an intersection of imaginary lines which connect positions of alignment keys in the plurality of alignment key areas, and a first center point, defined by imaginary lines which connect first positions of the plurality of first alignment marks, are overlapped.

2. The display device of claim 1, further comprising:
a display panel comprising a plurality of second alignment marks spaced from each other,
wherein the alignment center point and a second center point, defined by an intersection of imaginary lines connecting second positions of the plurality of second alignment marks, are overlapped.

3. The display device of claim 1,
wherein the window comprises a display part on which images are displayed and a non-display part configured to block images,
wherein the non-display part has the plurality of alignment key areas and the printed areas, and
wherein a shape of the display part when viewed in a plane is substantially circular or elliptical.

4. The display device of claim 3,
wherein the display part is symmetrical with respect to an imaginary X-axis parallel to a first direction and is symmetrical with respect to an imaginary Y-axis parallel to a second direction perpendicular to the first direction, and a center point of the display part is an intersection of the X-axis and Y-axis.

5. The display device of claim 1,
wherein the printed layer is on the printed area and comprises a printing material.

6. The display device of claim 5,
wherein the printing material comprises a printed film.

* * * * *